US012205821B2

(12) United States Patent
Taylor et al.

(10) Patent No.: US 12,205,821 B2
(45) Date of Patent: Jan. 21, 2025

(54) HYDROGEN-PASSIVATED TOPOLOGICAL MATERIALS, DEVICES, AND METHODS

(71) Applicant: U.S. Army DEVCOM, Army Research Laboratory, Adelphi, MD (US)

(72) Inventors: Patrick J. Taylor, Oakton, VA (US); George J. de Coster, Vienna, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 458 days.

(21) Appl. No.: 17/323,305

(22) Filed: May 18, 2021

(65) Prior Publication Data
US 2022/0375754 A1    Nov. 24, 2022

(51) Int. Cl.
*H01L 29/04*    (2006.01)
*H01L 21/30*    (2006.01)
*H10N 50/01*    (2023.01)
*H10N 50/80*    (2023.01)

(52) U.S. Cl.
CPC .......... *H01L 21/3003* (2013.01); *H01L 29/04* (2013.01); *H10N 50/01* (2023.02); *H10N 50/80* (2023.02)

(58) Field of Classification Search
CPC ..... H01L 21/3003; H01L 29/04; H01N 50/80; H01N 50/01
See application file for complete search history.

(56) References Cited

U.S. PATENT DOCUMENTS

| 5,068,040 | A | | 11/1991 | Jackson |
| 5,194,398 | A | | 3/1993 | Miyachi et al. |
| 5,464,664 | A | | 11/1995 | Aydil et al. |
| 5,494,643 | A | | 2/1996 | Kennedy, III |
| 5,972,765 | A | * | 10/1999 | Clark ................ H01L 29/66575 |
| | | | | 257/E21.194 |
| 6,159,421 | A | | 12/2000 | Fujii |
| 6,632,711 | B2 | | 10/2003 | Sugano et al. |
| 9,196,497 | B2 | | 11/2015 | Holland et al. |

(Continued)

FOREIGN PATENT DOCUMENTS

JP     2004128438    *    4/2004

OTHER PUBLICATIONS

J. Zhang, et.al., , Nat. Comm. 2, (2011) 574.

(Continued)

*Primary Examiner* — Robert M Kunemund
(74) *Attorney, Agent, or Firm* — Christos S. Kyriakou

(57) ABSTRACT

A topological material includes a lattice crystalline structure; and a material defect in the lattice crystalline structure that is treatable by hydrogen passivation that chemically mitigates an electronic charge associated with the material defect. The lattice crystalline structure includes dangling bonds in an atomic arrangement of the material defect of the lattice crystalline structure, and the hydrogen passivation may apply hydrogen to chemically passivate the dangling bonds of the material defect. The hydrogen passivation may be achieved by diffusing hydrogen into common materials of the lattice crystalline structure. The hydrogen passivation may chemically and/or electrostatically neutralize an electronic activity associated with the material defect.

14 Claims, 6 Drawing Sheets

(56) References Cited

U.S. PATENT DOCUMENTS

2007/0113012 A1* 5/2007 Cable .................... G03H 1/2286
                711/118
2018/0175042 A1* 6/2018 Jang ....................... H10B 12/09
2019/0312035 A1* 10/2019 Takuma .............. H01L 23/5283

OTHER PUBLICATIONS

N. Koirala, et. al., Nano Letters 15, No. 12 (2015) 8245-8249.
Y. G. Semenov, et. al., Phys. Rev. B 86, 161406 (2012).
X. Duan, et. al., Phys. Rev. Applied 2, 044003 (2014).

* cited by examiner

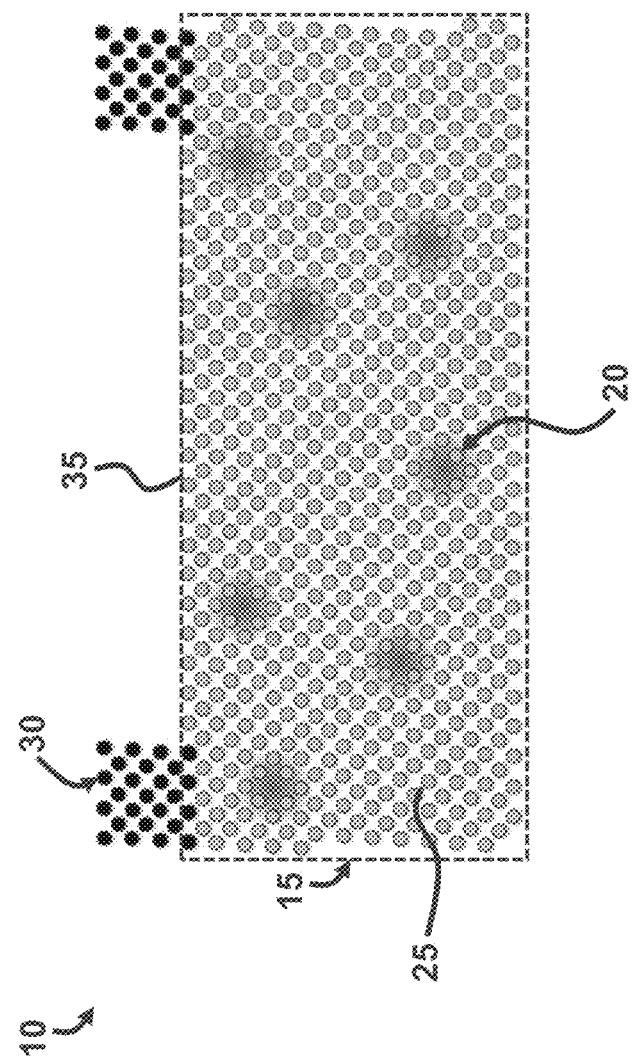

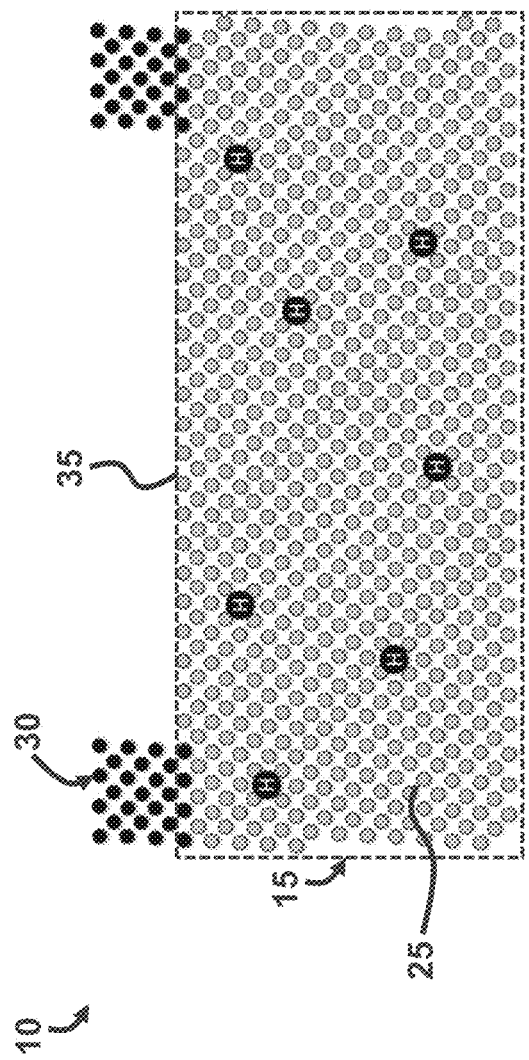

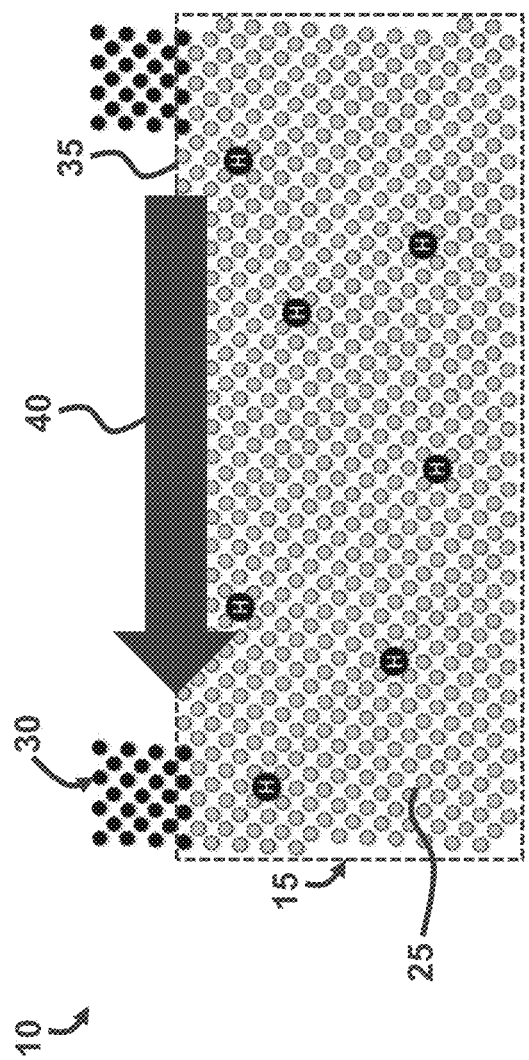

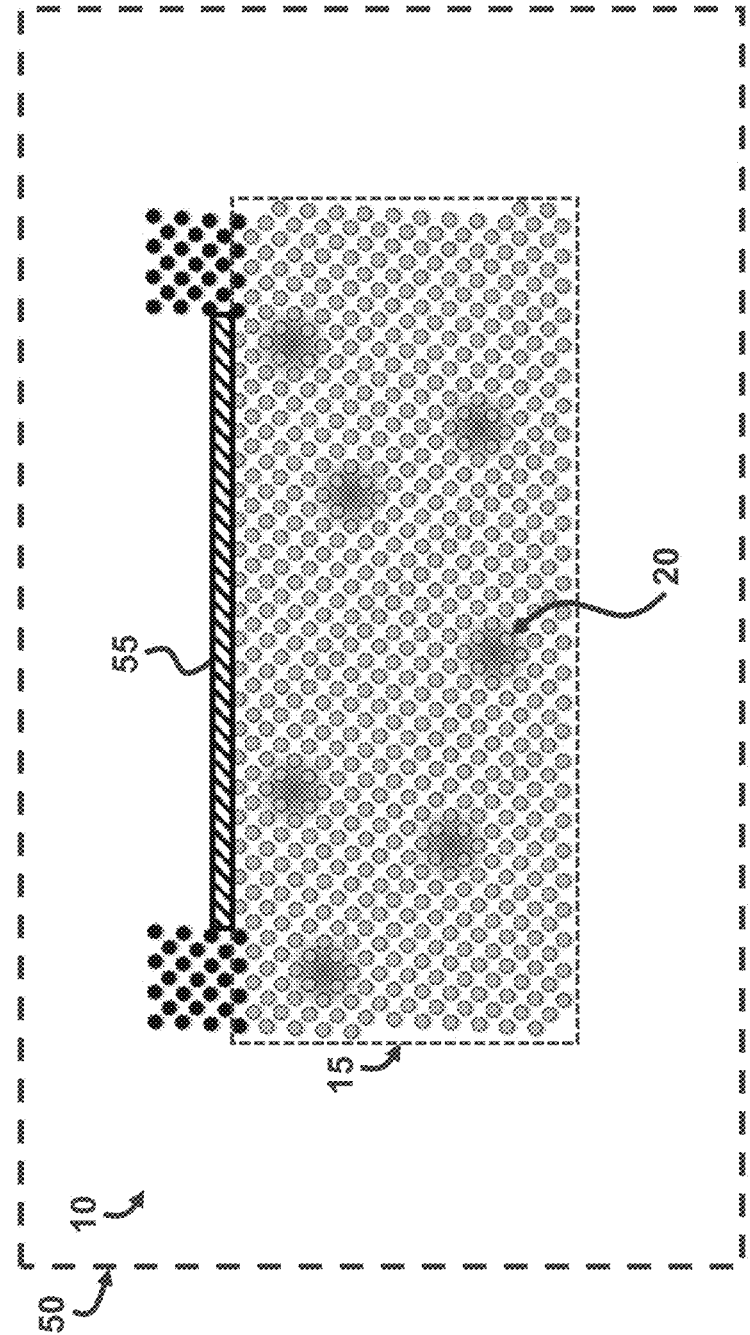

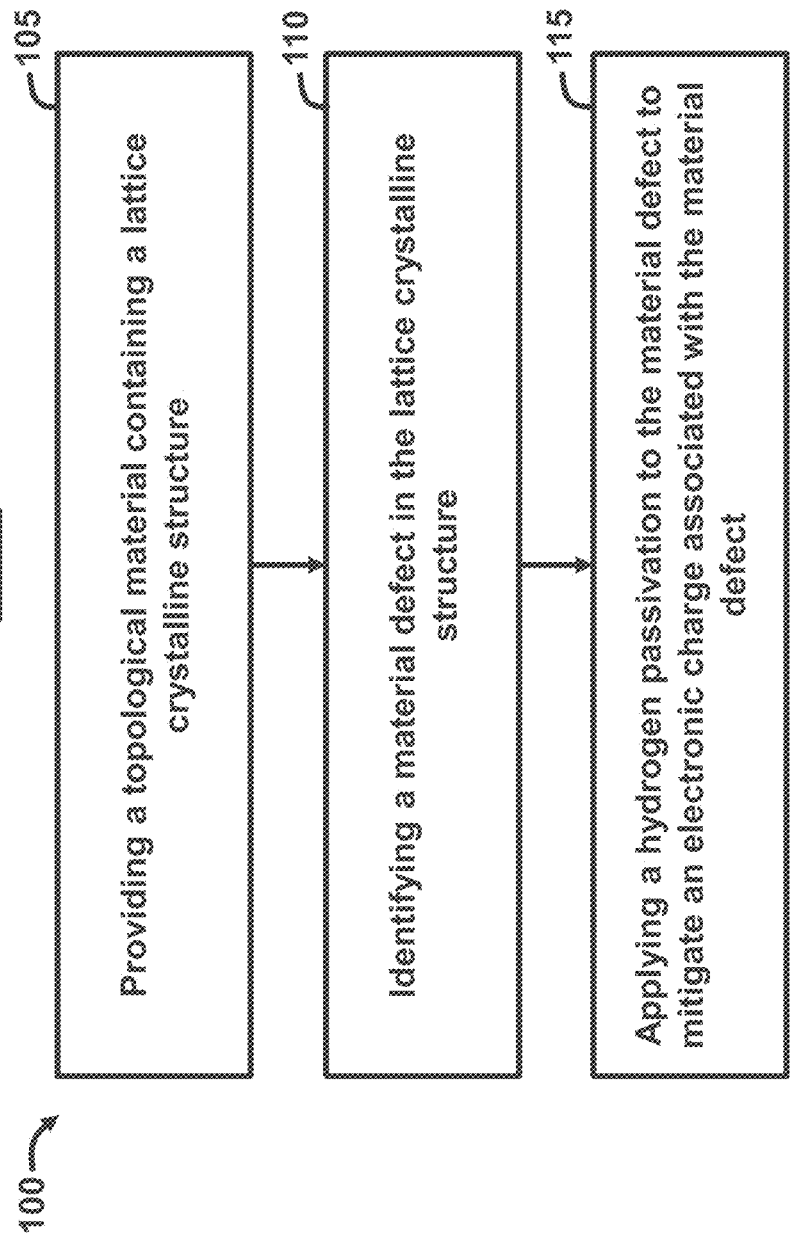

HYDROGEN-PASSIVATED TOPOLOGICAL MATERIALS, DEVICES, AND METHODS

GOVERNMENT INTEREST

The embodiments herein may be manufactured, used, and/or licensed by or for the United States Government without the payment of royalties thereon.

BACKGROUND

Technical Field

The embodiments herein generally relate to electronic properties of devices containing topological materials, and more particularly to mitigating unwanted electrical charge in electronic devices.

Description of the Related Art

Generally, many types of freshly-prepared topological materials contain adventitious defects to their crystalline structure. These defects include common types of defects such as point defects (vacancies, interstitials, etc.) as well as linear and planar defects (anti-phase domains, dislocations, twins, etc.) and because these defects are associated with incomplete chemical bonding, they are electrically charged unless they can be passivated. The electrically charged defects interfere with the desired topological properties and acutely limit the application for future device technologies. Presently, there is no effective solution to mitigate the deleterious effects from unpassivated defects in topological materials. Generally, the conventional solutions for mitigating defects and their unwanted electrical charge in topological materials involve growing bulk materials in ingot form; however bulk materials are not amenable to modern integrated circuitry. Another solution is to employ custom, non-commercial substrates, but this path is also inconsistent with modern integrated circuit design and fabrication. There are approaches, however, aimed to circumvent their undesired effects. The most common approach is to use cryogenic cooling (<4K) which simply masks the defects from influencing the desired topological phenomena. Another common approach is to introduce alloying agents whose purpose is to perturb the bulk properties while leaving the topological properties on the surface unaffected. For example, the $(Bi,Sb)_2(Se,Te)_3$ materials can be improved by alloying with sulfur and tin. There are disadvantages of these approaches. The principal drawback is that they are expensive and add complexity to eventual device realization. Cryogenic cooling is not practical for electronics platforms, and fabricating devices from complicated alloys is not preferred.

SUMMARY

In view of the foregoing, an embodiment herein provides a topological material comprising a lattice crystalline structure; and a material defect in the lattice crystalline structure that is treatable by hydrogen passivation that chemically mitigates an electronic charge associated with the material defect. The lattice crystalline structure may comprise dangling bonds in an atomic arrangement of the material defect of the lattice crystalline structure, and the hydrogen passivation may apply hydrogen to chemically passivate the dangling bonds of the material defect. The hydrogen passivation may be achieved by diffusing hydrogen into common materials of the lattice crystalline structure. The hydrogen passivation may chemically and/or electrostatically neutralize an electronic activity associated with the material defect by completing the chemical bonding caused by the incomplete bonding at the defect(s).

Another embodiment provides an electronic device comprising a topological material containing a lattice crystalline structure and having a topologically non-trivial electronic band structure; and a material defect in the lattice crystalline structure that is treatable by hydrogen passivation that chemically and/or electrostatically neutralizes an electronic activity associated with the material defect by completing the chemical bonding caused by the incomplete bonding at the defect(s). The topological material may comprise 2D or 3D topological insulators, Weyl semimetals, Dirac semimetals, Chern insulators, topological Kondo insulators, or a combination thereof. The electronic device may comprise a magnetic layer on the topological material. The topological material(s) listed above may be integrated with non-topological substrates such as any of silicon, III-V semiconductors, sapphire, and II-VI semiconductors as a path toward future device platforms. The hydrogen passivation may optimize spin-polarized electronic transport of the topological material.

Another embodiment provides a method of performing hydrogen passivation during fabrication of an electronic device containing a topological material, the method comprising providing the topological material containing a lattice crystalline structure; identifying a material defect in the lattice crystalline structure; and applying a hydrogen passivation to the material defect to mitigate an electronic charge associated with the material defect. The hydrogen passivation may be achieved by diffusing hydrogen into common materials of the lattice crystalline structure.

The hydrogen passivation may create a chemical reaction with electronic charge centers in the material defect to chemically and/or electrostatically neutralize an electronic activity associated with the material defect by completing the chemical bonding caused by the incomplete bonding at the defect(s). The hydrogen passivation may comprise applying high-energy ultraviolet light to the topological material. The high-energy ultraviolet light may then diffuse into the topological material and cause defects to be passivated. In this process, diatomic hydrogen dissociates to atomic hydrogen, which may be more prone to chemical interaction and passivation of defects. The hydrogen passivation may comprise applying hydrogen gas to the material defect. The hydrogen passivation may comprise performing thermal cracking of the diatomic hydrogen by a heated incandescent filament to form atomic hydrogen which may be more chemically reactive with the defects in the material. The method may comprise heating the incandescent filament to greater than 2200 K. The method may comprise depositing a layer of magnetic material on the topological material. The method may comprise diffusing atomic hydrogen through the magnetic material during an annealing process performed on the topological material during fabrication of the electronic device. The method may comprise growing the topological material in a thin film deposition tool (e.g., sputtering, metal-organic chemical vapor deposition (MOCVD), physical vapor deposition (PVD), evaporation, molecular-beam epitaxy (MBE), etc.) without breaking vacuum prior to performing the hydrogen passivation. The method may comprise performing the hydrogen passivation after full device fabrication is complete.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1A is a schematic diagram illustrating a topological material as an array of ordered atoms with metal ohmic contacts, according to an embodiment herein;

FIG. 1C is a schematic diagram illustrating the topological material of FIG. 1A after undergoing hydrogen passivation, according to an embodiment herein;

FIG. 1D is a schematic diagram illustrating the topological material of FIG. 1C showing the results of topological surface state current and without parasitic current after performing hydrogen passivation, according to an embodiment herein;

FIG. 2 is a block diagram illustrating an electronic device, according to an embodiment herein; and FIG. 3 is a flow diagram illustrating a method of performing hydrogen passivation during fabrication of an electronic device, according to an embodiment herein.

DETAILED DESCRIPTION

Figure 1B:
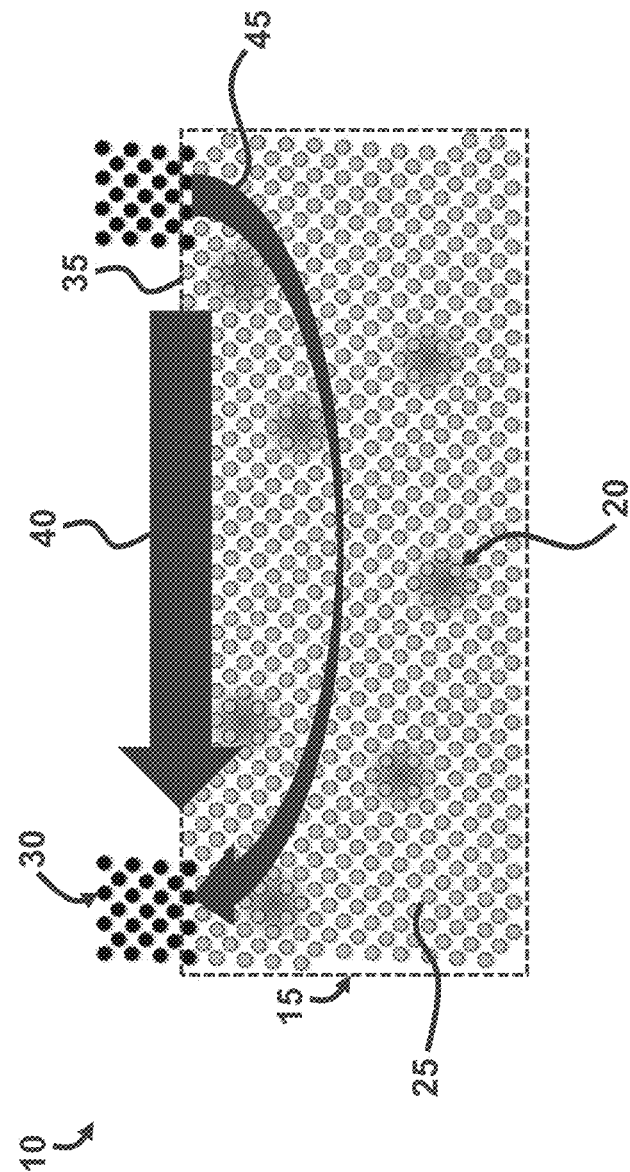
FIG. 1B is a schematic diagram illustrating the topological material of FIG. 1A showing the results of topological surface state current and parasitic current prior to performing hydrogen passivation, according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a topological material (e.g., 2D/3D topological insulators, Weyl semimetals, Dirac semimetals, Chern insulators, topological Kondo Insulators, etc.) whose native defects are passivated with atomic hydrogen so as to neutralize their electronic activity. A topological material comprises a topologically non-trivial electronic band structure. Moreover, the embodiments herein provide a production-friendly process for fabricating topological devices, and heterostructures with other materials such as magnetically active layers. Because hydrogen passivation can be independent of device fabrication, it can be an independent back-end process that does not disturb the primary fabrication processes. Referring now to the drawings, and more particularly to FIGS. 1A through 3, where similar reference characters denote corresponding features consistently throughout the figures, there are shown preferred embodiments. In the drawings, the size and relative sizes of components, layers, and regions, etc. may be exaggerated for clarity.

FIG. 1A illustrates a topological material 10 comprising a lattice crystalline structure 15, and a material defect 20 in the lattice crystalline structure 15 that is treatable by hydrogen passivation that chemically mitigates an electronic charge associated with the material defect 20. In some examples, the topological material 10 may comprise 2D/3D topological insulators, Weyl semimetals, Dirac semimetals, Chern insulators, or topological Kondo insulators, etc., among other types of topological materials. The topological material 10 may form the bulk material in an electronic device through which electrical current traverses, according to an example. The material defect 20 may be a missing atom space (i.e., "vacancy") in the topological material 20, which may be a result of a natural material structure of the topological material 10 or may be the result of the fabrication of the topological material 10. Moreover, the material defect 20, if untreated, may reduce the performance, longevity, stability, and overall quality of the electronic device containing the topological material 10. The lattice crystalline structure 15 may be in any suitable form, shape, thickness, or configuration in accordance with the embodiments herein. The hydrogen passivation stabilizes the topological material 10 by creating hydrogen bonds (e.g., as either covalent hydrogen bonding or ionized hydrogen bonding) with the surrounding atoms of the material defect 20.

For example, the lattice crystalline structure 15 may comprise dangling chemical bonds in an atomic arrangement of the material defect 20 of the lattice crystalline structure 15, and the hydrogen passivation may apply hydrogen to chemically passivate the dangling bonds of the material defect 20. As such, the dangling chemical bonds may be considered a material defect 20 of the lattice crystalline structure 15 of the topological material 10. Moreover, the gap energies of the topological material 10 may be altered as a result of the hydrogen passivation, thereby increasing the stability of the topological material 10 and mitigating the parasitic current effects once the electronic device containing the topological material 10 is activated. The hydrogen passivation may be achieved by diffusing hydrogen into common materials of the lattice crystalline structure 15. Furthermore, the hydrogen passivation may chemically and/or electrostatically neutralize an electronic activity (e.g., the parasitic current effects) associated with the material defect 20 by completing the chemical bonding caused by the incomplete bonding at the material defect(s) 20. The use of hydrogen adds several new novel features including (1) the ability of hydrogen to rapidly diffuse deep into the lattice crystalline structure 15 of the topological material 10, and (2) the ability of atomic hydrogen (e.g., as either charged ions or uncharged radicals) to chemically and/or electrostatically react with charge centers to neutralize their unwanted effects.

In FIG. 1A, the topological material 10 comprises an array of ordered atoms 25 positioned in the topological material 10 with a pair of metal ohmic contacts 30 on the surface 35 of the lattice crystalline structure 15. In FIG. 1A, seven random missing atom spaces (e.g., lattice vacancies or defects 20) in the topological material 10 are illustrated as a region or charge cloud of electrostatic charge associated with each vacancy. The seven random material defects 20 are simply examples in FIG. 1A, and as such the embodiments herein are not restricted to a particular number, size, or location of the defects 20 in the topological material 10.

In FIG. 1B, the undesired result of the charged vacancies is shown during device operation. The desired topological surface state current 40 that travels only on the surface through the topological surface state is the signal, and the undesired "parasitic" current 45 through the bulk of the material caused by charged vacancies and causes noise in the output. The device performance suffers because of poor signal to noise.

In FIG. 1C, the same topological material 10 that has had the seven randomly dispersed vacancies passivated with atomic hydrogen is illustrated. Again, seven vacancies are chosen by way of example only, and the embodiments herein are not restricted to any particular number of such vacancies (i.e., defects 20). Because the electrostatic charge from each vacancy has been neutralized through the hydrogen passivation process, the charge clouds shown in FIGS. 1A and 1B are gone in FIG. 1C, and to depict this, the charge clouds of FIGS. 1A and 1B are replaced with an atom position with the letter "H" to identify the passivated vacancy-hydrogen complex in FIG. 1C. Accordingly, these "H" locations refer to a neutralized vacancy enabled by hydrogen passivation that provides an electrically insulating bulk that passes no parasitic current therethrough.

In FIG. 1D, the desired result of the proper device operation is illustrated. The topological current 40 that travels only on the surface 35 through the topological surface state, and the undesired "parasitic" current through the bulk of the material has been completely mitigated (i.e., no current) by the hydrogen passivation. The undesired bulk current 45 (of FIG. 1B) is gone because the bulk has become completely insulating. The device performance is optimized because the signal to noise is maximized because of hydrogen passivation.

The primary problem that the embodiments herein address is the prevalence of unwanted conductivity in the bulk material of electronic devices caused by material defects 20. Bulk conductivity short-circuits the more interesting surface currents 40 associated with the topological surface states that mediate and optimize spin-polarized electronic transport. In order for topologically enabled devices to find practical applications, the relative contribution of the spin-polarized surface current 40 must be made to be large with respect to parasitic transport current 45 in the bulk material (i.e., topological material 10). As such, the hydrogen passivation of defects 20 are a critical enabling process to mitigate bulk transport.

The embodiments herein use atomic hydrogen to mitigate the deleterious effects of point defects 20 in the broad family of topologically active materials 10. In an example, consider the $(Bi,Sb)_2(Se,Te)_3$ family of topological insulators. For the case of pure $Bi_2Se_3$, selenium atoms that are residing on a lattice location that is normal for selenium ($Se_{Se}$) can evaporate to gas-phase $Se_g$ forming a vacancy of selenium (VSe).

Because each $Se_{Se}$ shares two covalent bonds with a bismuth atom on the lattice, a Vse results in two dangling bonds as given as:

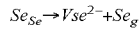

The issue is a problem because the number density of selenium vacancies in the lattice usually causes a sufficiently large charge density that the Fermi level rises into the bulk conduction band. To solve this issue, the embodiments herein employ ionized atomic hydrogen to counterbalance the unwanted charge density from the vacancies leaving a net neutral charge.

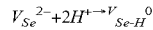

An equivalent way to express that is that the bismuth lone pair of unbound electrons form bismuth hydrogen bonds leaving no net charge remaining.

Another example can be found in the $(Pb_{1-x}Sn_x)(Te_{1-y}Se_y)$ family of topological crystalline insulators, bulk vacancies are again an issue leading to unfavorable doping. In this family of compounds, a vacancy of Pb (or Sn) yields a residual positive charge density (p-type), while a vacancy of Te (or Se) yields a residual negative charge density (n-type). Additionally, PbSnTe (111) surfaces are inherently polar, leading to many dangling bond states adverse to applications. Atomic hydrogen passivation is one approach to achieve remedy all of these issues because atomic hydrogen can diffuse deep into the bulk to neutralize the vacancies and can provide termination for surface bonding to passivate and obviate any trivial surface states that would otherwise be unwanted.

FIG. 2, with reference to FIGS. 1A through 1D, illustrates an electronic device 50 comprising a topological material 10 containing a lattice crystalline structure 15 and having a topologically non-trivial electronic band structure, and a material defect 20 in the lattice crystalline structure 15 that is treatable by hydrogen passivation that chemically and/or electrostatically neutralizes an electronic activity associated with the material defect 20 by completing the chemical bonding caused by the incomplete bonding at the defect(s) 20. In an example, the electronic device 50 may be a silicon-based device such as a semiconductor device. The topological material 10 may comprise 2D or 3D topological insulators, Weyl semimetals, Dirac semimetals, Chern insulators, topological Kondo insulators, or a combination thereof. The electronic device 50 may further comprise a magnetic layer 55 on the topological material 10. The magnetic layer 55 may comprise any suitable type of ferromagnetic materials, for example. In this regard, some device applications of topological insulators generally require a thin layer of magnetic material deposited on top. The thinness of the magnetic layer 55 permits atomic hydrogen to diffuse therethrough during an annealing process in the formation of the electronic device 50.

The topological material 10 may be integrated with common substrate platforms such as any of non-topological silicon, III-V semiconductors, and II-VI semiconductors. The hydrogen passivation may optimize spin-polarized electronic transport of the topological material 10. Another novel aspect of the embodiments herein is that hydrogen passivation can be a post processing technique in the overall fabrication of the electronic device 50. In an example, the full heterostructure of the electronic device 50 could first be grown in a thin film process (sputtering, metal-organic chemical vapor deposition (MOCVD), physical deposition (PVD) or molecular-beam epitaxy (MBE), etc. none shown) without breaking vacuum, and then the material defects 20 can be passivated with hydrogen after full device fabrication is complete.

FIG. 3, with reference to FIGS. 1A through 2, is a flow diagram illustrating a method 100 of performing hydrogen passivation during fabrication of an electronic device 50 containing a topological material 10. The method 100 comprises providing (105) the topological material 10 containing a lattice crystalline structure 15. The topological material 10 may comprise, for example, 2D or 3D topological insulators, Weyl semimetals, Dirac semimetals, Chern insulators, topological Kondo insulators, etc. Next, the method 100 comprises identifying (110) a material defect 20 in the lattice crystalline structure 15. In an example, the material defects 20 may be identified through electron microscopy of the lattice crystalline structure 15. Then, the method 100 comprises applying (115) a hydrogen passivation to the material defect 20 to mitigate an electronic charge associated with the material defect 20.

The method 100 provides a production-friendly technique which prevents parasitic bulk conduction by passivating defects with atomic hydrogen. The atomic hydrogen passivation reduces the electrical activity of native defects 20 and enables the dominance of desirable topological transport. Common topological materials 10 (e.g., 2D or 3D topological insulators, Weyl semimetals, Dirac semimetals, Chern insulators, topological Kondo insulators, etc.) may contain defects 20 and those defects 20 can be a source of unwanted electronic charge. The method 100 uses atomic hydrogen to chemically mitigate that unwanted charge.

In an example, the hydrogen passivation may be achieved by diffusing hydrogen into common materials of the lattice crystalline structure 15. Moreover, the hydrogen passivation may create a chemical reaction with electronic charge centers in the material defect 20 to chemically and/or electrostatically neutralize an electronic activity (e.g., passive current) associated with the material defect 20 by completing the chemical bonding caused by the incomplete bonding at the defect(s) 20. The step of applying (115) the hydrogen passivation to the material defect 20 may occur in several different ways. In a first example, the hydrogen passivation may comprise producing atomic hydrogen and/or ionic hydrogen from diatomic hydrogen gas ($H_2$) by irradiation with high-energy ultraviolet light and causing that atomic hydrogen to chemically interact with material defects 20. In a second example, the hydrogen passivation may comprise applying hydrogen gas to the material defect 20. In a third example, the hydrogen passivation may comprise performing thermal cracking of diatomic hydrogen to form atomic hydrogen radicals, or ionic hydrogen, by a heated incandescent filament and causing those to passivate the dangling bonding at the material defect 20. Moreover, the hydrogen passivation comprises performing the thermal cracking of the diatomic hydrogen, by the heated incandescent filament, to atomic hydrogen, which diffuses into the crystal lattice of the topological material 10 and passivates unwanted defects 20. According to an example, the method 100 may comprise heating the incandescent filament to greater than 2200 K.

The method 100 may comprise depositing a layer 55 of magnetic material on the topological material 10. Furthermore, the method 100 may comprise diffusing atomic hydrogen through the magnetic material during an annealing process performed on the topological material 10 during fabrication of the electronic device 50. Additionally, the method 100 may comprise growing the topological material 10 in a common production-style deposition tool or system (e.g., sputtering, metal-organic chemical deposition (MOCVD), physical vapor deposition (PVD, evaporation, molecular-beam epitaxy (MBE), etc.) without breaking vacuum prior to performing the hydrogen passivation. According to an example, the method 100 may comprise performing the hydrogen passivation after full device fabrication is complete.

There are several practical applications of topological materials 10. First, electronic devices 50 based on new topological materials 10 can have greater efficiency and lower power consumption compared to conventional devices like those based on silicon CMOS because they offer a new electrical conduction mechanism that is confined to an ultra-thin surface channel that is free of backscattering. Second, new electronic devices 50 with sensitivity to the spin quantum property of electrons can be obtained because topological materials 10 impart spin-momentum locking phenomena within the thin, conducting surface channel. Some examples of spin-sensitive devices are extremely low-power magnetic memory elements, as well as polarization-sensitive photodetectors.

Computing and logic-based electronic devices based on topological materials 10 provided by the embodiments herein can have greater efficiency and lower power consumption compared to conventional devices like those based on silicon CMOS. More than an order of magnitude in efficiency may be obtained, and so battery life for portable electronics (smartphones, laptops, tablets, etc.) may be increased by more than ten times. Further examples of applications of the embodiments herein include spin-sensitive devices such as extremely low-power magnetic memory elements, as well as polarization-sensitive photodetectors. Polarization images, which are normally large and bulk, might be miniaturized to the point where they could be mounted on lightweight, handheld drones, for example.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. An electronic device comprising:
    a topological material containing a lattice crystalline structure and having a topologically non-trivial electronic band structure; and
    a material defect in the lattice crystalline structure that is treatable by hydrogen passivation that chemically and/or electrostatically neutralizes an electronic activity associated with the material defect
    and further comprising a comprising a magnetic layer on the topological material.

2. The electronic device of claim 1, wherein the topological material comprises 2D or 3D topological insulators, Weyl semimetals, Dirac semimetals, Chern insulators, topological Kondo insulators, or a combination thereof.

3. The electronic device of claim 1, wherein the topological material is integratable onto substrates comprising any of silicon, III-V semiconductors, and II-VI semiconductors.

4. The electronic device of claim 1, wherein the hydrogen passivation optimizes spin-polarized electronic transport of the topological material.

5. A method of performing hydrogen passivation during fabrication of an electronic device containing a topological material, the method comprising:
    providing the topological material containing a lattice crystalline structure;
    identifying a material defect in the lattice crystalline structure; and
    applying a hydrogen passivation to the material defect to mitigate an electronic charge associated with the material defect, and
    further comprising depositing a layer of magnetic material on the topological material.

6. The method of claim 5, wherein the hydrogen passivation is achieved by diffusing hydrogen into common materials of the lattice crystalline structure.

7. The method of claim 5, wherein the hydrogen passivation creates a chemical reaction with electronic charge centers in the material defect to chemically neutralize an electronic activity associated with the material defect.

8. The method of claim 5, wherein the hydrogen passivation comprises applying high-energy ultraviolet light to the topological material, and wherein the high-energy ultraviolet light diffuses into the topological material and causes defects to be passivated.

9. The method of claim 5, wherein the hydrogen passivation comprises applying hydrogen gas to the material defect.

10. The method of claim 5, wherein the hydrogen passivation comprises performing thermal cracking of the diatomic hydrogen, by a heated incandescent filament, to atomic hydrogen which diffuses into the crystal lattice of the topological material and passivates unwanted defects.

11. The method of claim 10, comprising heating the incandescent filament to greater than 2200 K.

12. The method of claim 5, comprising diffusing atomic hydrogen through the magnetic material during an annealing process performed on the topological material during fabrication of the electronic device.

13. The method of claim 5, comprising growing the topological material in a thin film deposition tool without breaking vacuum prior to performing the hydrogen passivation.

14. The method of claim 5, comprising performing the hydrogen passivation after full device fabrication is complete.

* * * * *